(12) United States Patent
Tamaki et al.

(10) Patent No.: US 6,320,376 B1
(45) Date of Patent: Nov. 20, 2001

(54) MAGNETIC FIELD SENSOR AND SYSTEM FOR MEASURING A MAGNETIC FIELD INCLUDING A PLURALITY OF CONDUCTORS ELECTRICALLY CONNECTED IN A LOOP

(75) Inventors: Naoya Tamaki; Norio Masuda; Masahiro Yamaguchi; Ken-Ichi Arai, all of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/453,389

(22) Filed: Dec. 2, 1999

(30) Foreign Application Priority Data

Jun. 1, 1999 (JP) .................................................. 11-153259

(51) Int. Cl.$^7$ .............................. G01R 33/02; H01F 5/00
(52) U.S. Cl. ......................... 324/258; 324/249; 324/260; 336/200
(58) Field of Search .............................. 324/96, 258, 127, 324/117 R, 117 H, 142, 244, 252, 260; 336/200

(56) References Cited

U.S. PATENT DOCUMENTS 4,913,152 * 4/1990 Ko et al. ........................... 128/653 R

* cited by examiner

Primary Examiner—Safet Metjahic
Assistant Examiner—Reena Aurora
(74) Attorney, Agent, or Firm—Hayes, Soloway, Hennessey, Grossman & Hage, PC

(57) ABSTRACT

A magnetic field sensor has a first conductor, a first insulating film, a second conductor, a second insulating film and a third conductor. The first conductor is composed of a "C-shaped" portion, which is formed in a C-like shape, and a linear portion, which is connected to one side of the "C-shaped" portion which is opposite to a gap of the "C-shaped" portion. The first insulating film is formed on the first conductor and has a hole in a predetermined position. The second conductor is formed in a ladle-like shape, and is formed on the first insulating film such that its one side corresponding to the front end of the ladle overlaps with a straight line, through which an outer edge of one end and an outer edge of the other end of the "C-shaped" portion. One side, corresponding to the front end of the ladle, of the second conductor crosses over the gap from one end of the "C-shaped" portion to the other end, and is connected to the other end of the "C-shaped" portion via a hole of the first insulating film. The second insulating film is formed on the second conductor and has a hole formed in a position substantially identical with a position of the first insulating film. The third conductor is formed in a shape substantially identical with a shape of the first conductor. The third conductor is formed on the second insulating film and is connected to the second conductor via the hole of the second insulating film. The first, second and third conductors are thus connected with each other, thereby forming a loop.

9 Claims, 13 Drawing Sheets

MAGNETIC FIELD SENSOR AND SYSTEM FOR MEASURING A MAGNETIC FIELD INCLUDING A PLURALITY OF CONDUCTORS ELECTRICALLY CONNECTED IN A LOOP

BACKGROUND OF THE INVENTION

1. Field of the Invention

The present invention relates to a magnetic field sensor which can be used for measuring a magnetic field generated by a current flowing through wiring, etc., and also to a system for measuring a magnetic field generated by a current flowing through the wiring, etc.

2. Description of the Related Art

In order to detect EMC (ElectroMagnetic Compatibility) of semiconductor integrated circuits and the like, a high-frequency current which flows to the semiconductor integrated circuits, etc. is measured. This high-frequency current can be measured by measuring a magnetic field which is generated by the current flowing through the semiconductor integrated circuits, etc.

A Hall effect device which utilizes the Hall effect is one of magnetic field sensors which can measure the magnetic field generated from the semiconductor integrated circuits, etc.

In order to measure a magnetic field, a current needs to be supplied to a semiconductor film or a metal film in the Hall effect device. This brings a problem that the Hall effect device consumes high electric power. The Hall effect device requires two input/output terminals for supplying the semiconductor film or the metal film with a current and two input/output terminals for measuring a voltage generated by a magnetic field. Therefore, it is difficult that the Hall effect device is miniaturized.

Another type of a magnetic field sensor, other than the Hall effect device, is one which utilizes electromagnetic induction. Such a magnetic field sensor includes a loop formed of a coaxial cable or conducting wires. The magnetic field sensor can measure the strength of a magnetic filed generated from the semiconductor integrated circuits, etc, by measuring the current which flows to the loop when the strength of the magnetic field varies.

Generally, the magnetic field sensor which utilizes electromagnetic induction is formed of a coaxial cable or conducting wires, etc., thus is large in size compared to the semiconductor integrated circuits. This means that the magnetic field sensor is too large to approach only the wiring from which a magnetic field to be measured is generated. That is, such a magnetic field sensor can not accurately measure the magnetic field which has been generated by a current flowing through a device, wiring, etc.

SUMMARY OF THE INVENTION

Accordingly, an object of the present invention is to provide a magnetic field sensor and a system for measuring a magnetic field, both of which can accurately measure a magnetic field.

Another object thereof is to provide a small-sized magnetic field sensor.

In order to achieve the above-described objects, according to the first aspect of the present invention, there is provided a magnetic field sensor comprising:

a first conductor layer having a first loop portion which is in an open loop shape and which includes two ends and a gap therebetween;

a second conductor layer having a second loop portion formed in an open loop shape on the first conductor layer; and a third conductor layer formed on the second conductor layer and having a third loop portion which is formed in an open loop shape and which has two ends and a gap therebetween, wherein the third loop portion is open in a direction substantially identical with an opening direction of the first loop portion and is formed in such a way that a first straight line, through which one end and other end of the first loop portion are connected with each other, substantially overlaps with a second straight line, through which one end and other end of the third loop portion are connected with each other, the second loop portion is formed in such a way that one side of the second loop portion overlaps with the first and second straight lines of the first loop portion and the third loop portion or the one side is formed outward with respect to the first loop portion and the third loop portion, and that the one side crosses over the gaps of the first loop portion and the third loop portion from one ends of the first loop portion and the third loop portion to other ends thereof, and the one side of the second loop portion is electrically connected to the one ends or the other ends of the first loop portion and the third loop portion, thereby forming a loop.

In the above structure, the second loop portion is formed in such a way that its one side is formed along the first straight line or in the outside of the first and third loop portion. Hence, when measuring a magnetic field from wiring, etc., the loop can approach the wiring, etc. Accordingly, the magnetic field sensor has a high degree of space resolution.

The magnetic field sensor may further comprise:

a first insulating layer which is formed between the first conductor layer and the second conductor layer and which has a hole in the one end or the other end of the first loop portion; and a second insulating layer which is formed between the second conductor layer and the third conductor layer and which has a hole in a position substantially identical with a position of the hole of the first insulating layer, wherein the second conductor layer includes a connector which electrically connects the second conductor layer to the first conductor layer via the hole of the first conductor layer, and the third conductor layer includes a connector which electrically connects the third conductor layer to the second conductor layer via the hole of the second insulating layer.

The third loop portion may be formed in a shape which is substantially identical with a shape of the first loop portion.

Width of the second loop portion may be narrower than width of the first loop portion and the third loop portion, and the second loop portion may be electrically sealed by the first loop portion and the third loop portion.

The first straight line may connect an outer edge of the one end and an outer edge of the other end of the first loop portion, and the second straight line may connect an outer edge of the one end and an outer edge of the other end of the third loop portion.

The first conductor layer, the second conductor layer and the third conductor layer may be formed of a titanium film formed on the first and/or second insulating layers and a copper film formed on the titanium film.

The first conductor layer may include the first loop portion, which is formed in a latter "C" or "U" like shape, and further includes a first linear portion, which is connected to an opposite side of the gap of the first loop portion.

The second conductor layer may further include a second linear portion, which is so connected to the second loop portion as to be formed in a ladle like shape.

The third conductor layer may include the third loop portion, which is formed in a letter "C" or "U" like shape, and may further include a third linear portion, which is connected to an opposite side of the gap of the third loop portion.

According to the second aspect of the present invention, there is provided a system for measuring a magnetic field, comprising a magnetic field sensor, a measuring device and a wire, wherein, the magnetic field sensor includes
  a first conductor layer having a first loop portion which is formed in an open loop shape and which includes two ends and a gap therebetween,
  a first insulating layer which is formed on the first conductor layer and which has a hole in one end of the first loop portion,
  a second conductor layer which has a second loop portion,
    having one side crossing over the gap of the first loop portion from other end of the first loop portion to one end along a first straight line, through which one end and other end of the first loop portion are connected with each other, or in an outside of the first loop, and
    being formed in an open loop shape and having a connector electrically connecting the second conductor layer and the first conductor layer via the hole of the first insulating film,
  a second insulating layer which is formed on the second conductor layer and which has a hole in a position substantially identical with a position of the hole of the first insulating layer, and
  a third conductor layer which is formed on the second insulating layer, and which has a third loop portion having two ends and a gap and being formed in an open loop shape which is open in a direction substantially identical with an opening direction of the first loop portion,
    including a connector electrically connecting the third conductor layer to the second conductor layer via the hole of the second insulating layer, and
    being formed in such a way that a second straight line, through which one end and other end of the third conductor layer are connected with each other, substantially overlaps with the first straight line, and
  the magnetic field sensor
    outputting an electric signal whose magnitude is in proportion to a change rate of a magnetic field crossing over a loop, which has been formed when the first conductor layer, the second conductor layer and the third conductor layer are electrically connected with each other, and
    having characteristic impedance which is substantially identical with characteristic impedance of the measuring device and the wire,
  the measuring device measuring strength of a magnetic field based on the electric signal output by the magnetic field sensor; and the wire connecting the magnetic field sensor and the measuring device.

Width of the first loop portion and the third loop portion may be broader than width of the second loop portion.

The second loop portion may electrically be sealed by the first loop portion and the third loop portion.

The first straight line may connect an outer edge of the one end and an outer edge of the other end of the first loop portion, and the second straight line may connect an outer edge of the one end and an outer edge of the other end of the third loop portion.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT (First Embodiment)

A magnetic field sensor according to the first embodiment of the present invention will now be explained with reference to the accompanying drawings.

Figure 1:
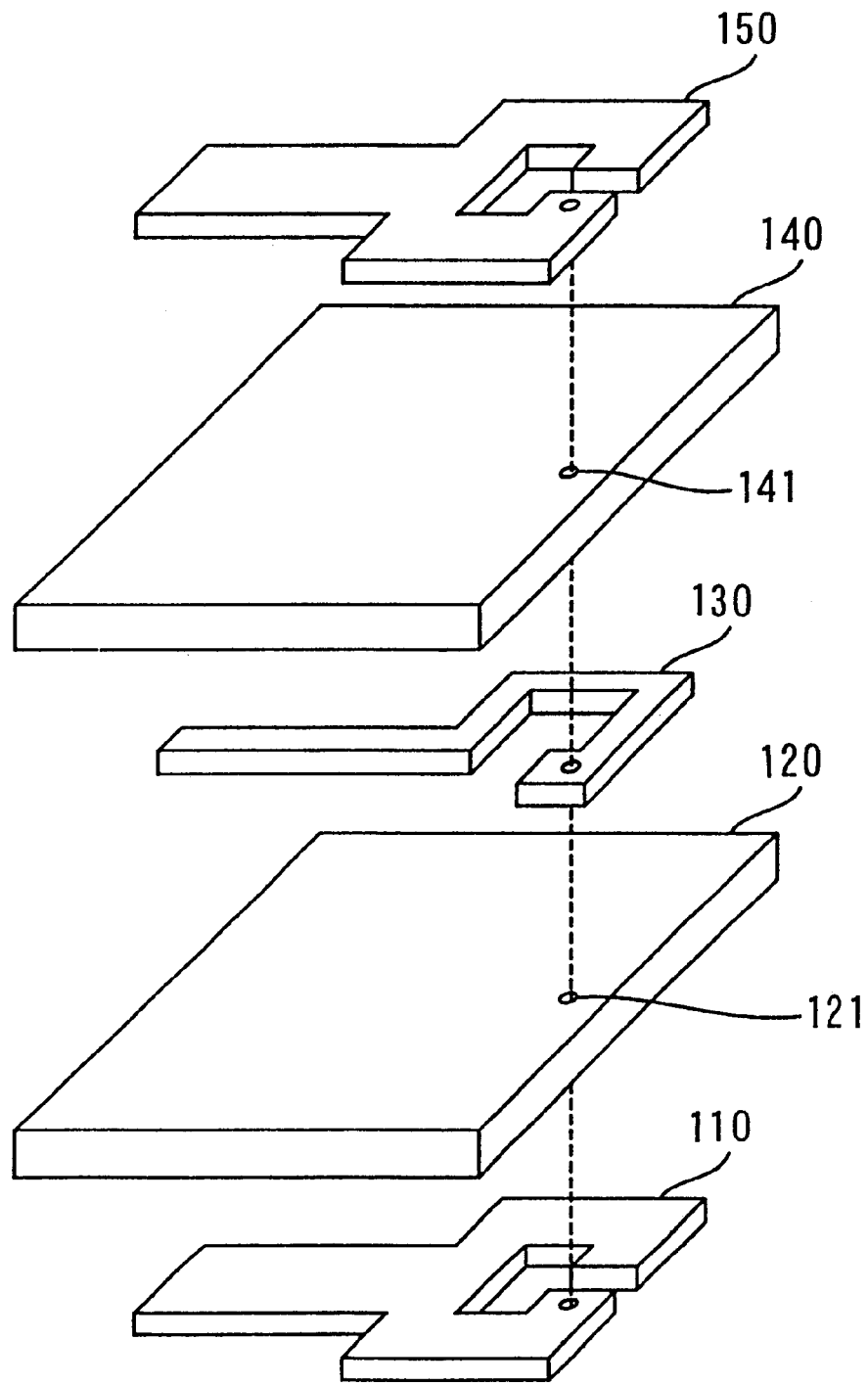
FIG. 1 is a diagram showing the structure of a magnetic field sensor according to the first embodiment of this invention.

FIG. 1 is a diagram showing the structure of the magnetic field sensor according to the first embodiment, and illustrates the main part of the magnetic field sensor.

As illustrated in FIG. 1, the magnetic field sensor is composed of a first conductor 110, a first insulating film 120, a second conductor 130, a second insulating film 140 and a third conductor 150.

The first conductor 110 is formed of three layers of, for example, Ti/Cu/Ti (titanium/copper/titanium). The first conductor 110 is substantially rectangular in cross section.

The first insulating film 120 is formed of, for example, SiOx, on the first conductor 110. The first insulating film 120 includes a via hole 121 in a predetermined area.

The second conductor 130 is formed of three layers of, for example, Ti/Cu/Ti titanium/copper/titanium), and is formed on the first insulating film 120. The second conductor 130 is electrically connected to the first conductor 110 via the via hole 121. The second conductor 130 is substantially rectangular in cross-section.

The second insulating film 140 is formed of, for example, SiOx, on the second conductor 130. The second insulating film 140 includes a via hole 141 which is formed in a position substantially identical with that of the via hole 121 in a vertical line.

The third conductor 150 is formed of two layers of, for example, Ti/Cu (titanium/copper), on the second insulating film 140. The third conductor 150 is electrically connected to the second conductor 130 via the via hole 141. The third conductor 150 is substantially rectangular in cross section.

Figure 2:
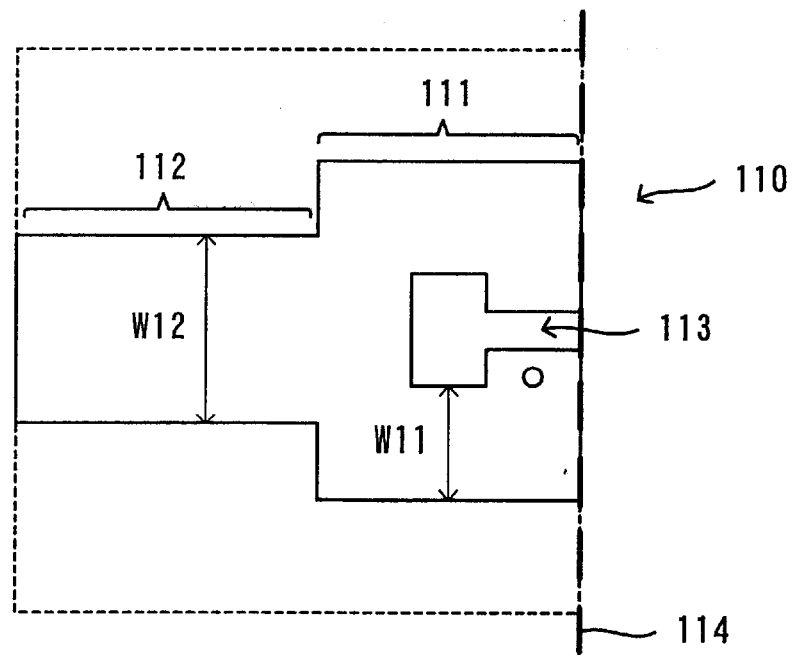
FIGS. 2A to 2D are diagrams each showing a formation pattern of a conductor constituting the magnetic field sensor shown in FIG. 1.
Figure 2:
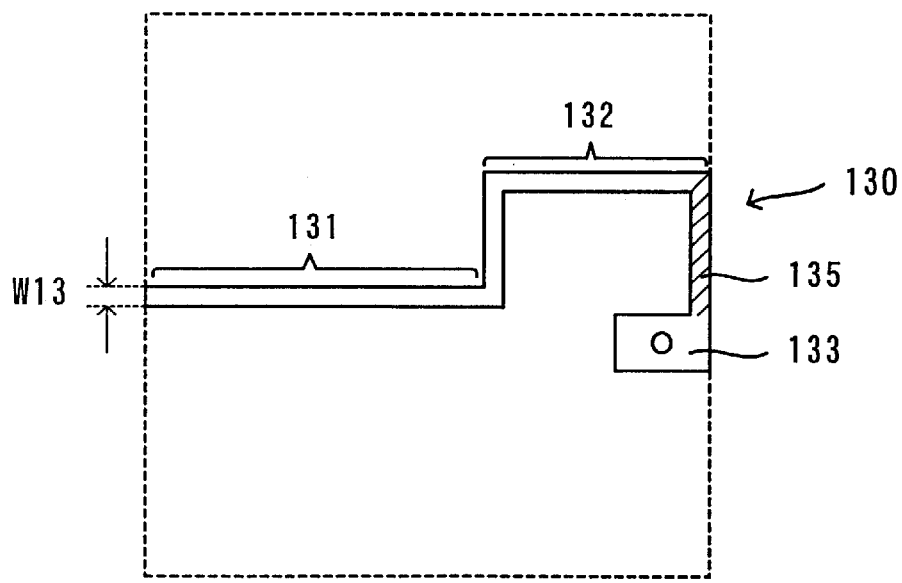
Figure 2C:
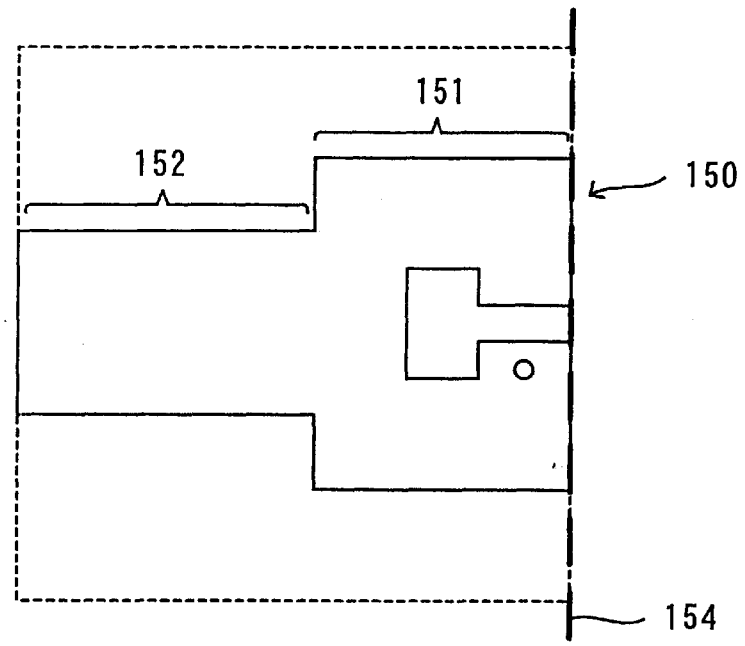
Figure 2D:
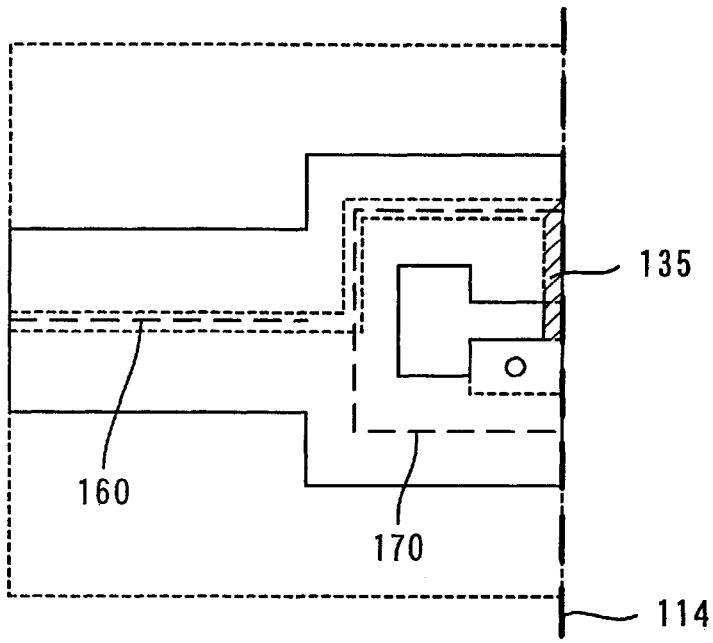

FIGS. 2A to 2D are plane views respectively showing formation patterns of the first conductor 110, the second conductor 130 and the third conductor 150. Specifically, FIG. 2A shows a formation pattern of the first conductor 110, FIG. 2B shows a formation pattern of the second conductor 130, FIG. 2C shows a formation pattern of the third conductor 150, and FIG. 2D shows a state where the first, second and third conductors 110, 130 and 150 overlap with each other. In each of FIGS. 2B and 2D, the hatching does not represent a cross section, but it indicates an area instead.

As shown in FIG. 2A, the first conductor 110 is formed of a "C-shaped" portion 111 (a portion formed in a letter "C" like shape) and a linear portion 112.

The "C-shaped" portion 111 is formed in an open loop shape. Specifically, the "C-shaped" portion 111 is formed in such a shape that it has been bent into a "C" shape, thereby including a gap 113.

The linear portion 112 is connected to one side of the "C-shaped" portion 111, specifically to the opposite side of the gap 113 at a right angle to the "C-shaped" portion 111. The width W12 of the linear portion 112 is broader than the width W11 of the "C-shaped" portion 111.

The second conductor 130 is formed in such a shape that it has been bent into a ladle-like shape, as illustrated in FIG. 2B. That is, the second conductor 130 is composed of a linear portion 131 corresponding to the handle of the ladle and a bent portion 132 corresponding to the vessel of the ladle. The width W13 of the second conductor 130 is narrower than the width W11 of the "C-shaped" portion 111. A pad 133 is formed in one end of the second conductor 130.

As shown in FIG. 2D, the linear portion 131 is so formed on the first insulating film 120 as to overlap with a center line 160 of the linear portion 112.

In FIG. 2D, the bent portion 132 is so formed on the first insulating film 120 that its one side 135 (indicated by the hatching as shown in the diagram) corresponding to one end of the ladle crosses over the gap 113 from one end of the "C-shaped" portion 111 to the other end. The bent portion 132 is formed in such a way that its one side 135 substantially overlaps with a straight line 114, through which an outer edge of one end and an outer edge of the other end of the "C-shaped" portion 111 are connected with each other. The rest of two sides of the bent portion 132 are formed as to overlap with a center line 170 of the "C-shaped" portion 111.

The pad 133 is electrically connected to the other end of the "C-shaped" portion 111 via the via hole 121 which is formed in the first insulating film 120.

The third conductor 150 is formed in a shape substantially identical with that of the first conductor 110. As shown in FIG. 2C, the third conductor 150 is composed of a "C-shaped" portion 151 and a linear portion 152. The third conductor 150 is formed on the second insulating film 140 in such a way that its outward form corresponds to the outward form of the first conductor 110. In this case, a straight line 154, through which an outer edge of the one end and an outer edge of the other end of the "C-shaped" portion 151 are connected with each other, substantially overlaps with the straight line 114, through which an outer edge of the one end and an outer edge of the other end of the "C-shaped" portion 111 are connected with each other. The third conductor 150 is connected to the second conductor 130 via the via hole 141 which is formed in a position which is substantially identical with the position of the via hole 121 in a vertical line.

The first, second and third conductors 110, 130 and 150 are thus connected with each other, thereby a loop is formed. It should be noted that the first, second and third conductors 110, 130 and 150 form a strip transmission line.

Because the first, second and third conductors 110, 130 and 150 are formed in the above-described form, the outward form of a projection, in which those conductors are shown as to overlap with each other, is symmetric with respect to the center line 160, as shown in FIG. 2D.

The widths of the first, second and third conductors 110, 130 and 150 are set in such widths that there is substantially no end effect of the electromagnetic field which may occur in the magnetic field sensor. Particularly, as explained above, the widths W11 and W12 of the first and third conductors 110 and 150 are set broader than the width W13 of the second conductor 130.

The widths of the first, second and third conductors 110, 130 and 150 are so set that characteristic impedance of the strip transmission line coincides with characteristic impedance of a measuring device connected to the magnetic field sensor when measuring a magnetic field and characteristic impedance of a coaxial cable connecting the magnetic field sensor to the measuring device. When the characteristic impedance of the measuring device and the coaxial cable is 50Ω or 75Ω, the width W12 of the linear portions 112 and 152 is set to 60 $\mu$m, the width W11 of the "C-shaped" portions 111 and 151 is set to 30 $\mu$m, and the width W13 of the linear portion 131 and the bent portion 132 is set to 5.4 $\mu$m.

Figure 3:
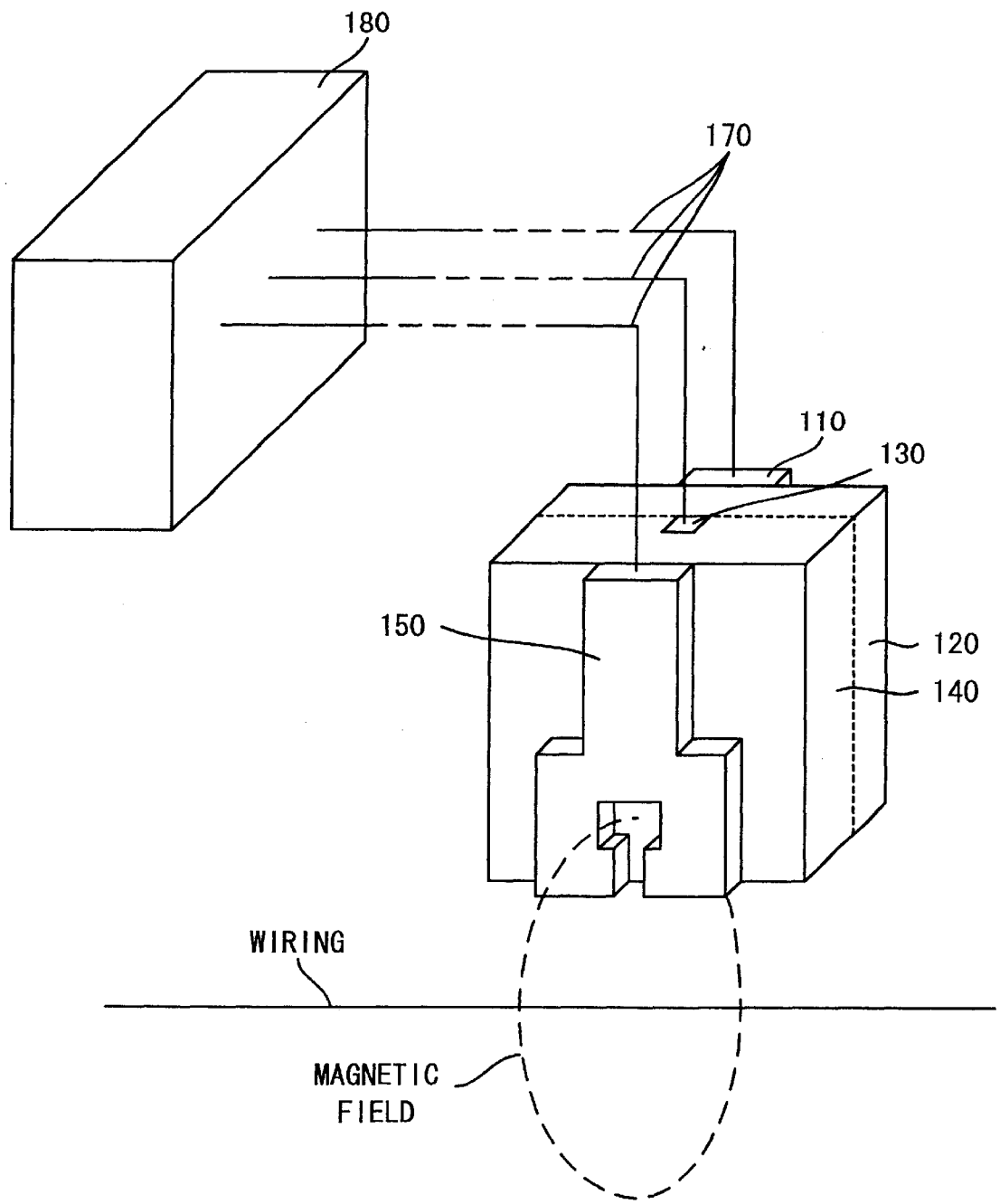
FIG. 3 is a diagram exemplifying the usage of the magnetic field sensor shown in FIG. 1.

In a case where to measure a magnetic field which is generated by a current flowing through wiring formed on a print substrate or a semiconductor substrate, the magnetic field sensor is arranged in such a way that its loop side faces the wiring, as shown in FIG. 3. The first, second and third conductors 110, 130 and 150 are connected to a measuring device 180, such as a spectrum analyzer, etc., via a pad, a coaxial cable 170 or the like. In this case, the first conductor 110 and the third conductor 150 are both grounded. A resistor (not illustrated) is connected between the first and second conductors 110 and 130, and another resistor is connected between the second and third conductors 130 and 150.

When measuring the magnetic field, the magnetic field generated by a current flowing though the wiring goes across the loop of the magnetic field sensor, whereby generating an electromotive force whose magnitude is in proportion to a change rate of the magnetic field, according to the Faraday law of induction. The measuring device 180 detects as an output signal the voltage which has been generated on both sides of the resistors between the first and second conductors 110 and 130 and between the second and third conductors 130 and 150.

As explained above, the widths of the first, second and third conductors 110, 130 and 150 are set in such a way that characteristic impedance of the strip transmission line coincides with characteristic impedance of the coaxial cable 170, the measuring device 180, etc. Hence, it becomes possible to measure a magnetic field generated by a current flowing through a semiconductor integrated circuit wherein an operational frequency is set at any GHz in order. Furthermore, a signal output from the magnetic field sensor toward the measuring device 180, etc., can be restrained from reflecting.

Since the first, second and third conductors 110, 130 and 150 are thus formed, the second conductor 130 is electrically sealed by the first and third conductors 110 and 150. As a result of this, the voltage which has been induced by an electric field can be restrained. Then, as an output signal, the voltage induced by the magnetic field which has been generated by a current flowing through the semiconductor integrated circuit, etc. is output. The space distribution of the magnetic field can appropriately be measured.

The side 135, corresponding to the end of the ladle, of the bent portion 132 is formed along the straight line 114 through which the outer edge of the one end and the outer edge of the other end of the "C-shaped" portion 111 are connected with each other. Thus, when measuring the magnetic field generated by a current flowing through the wiring, etc., the loop approaches the wiring, etc. Even in a case where a plurality of magnetic field generating sources are present, the magnetic field sensor can measure only the to-be-measured magnetic field from any of the magnetic field generating source, and has a high degree of space resolution.

An explanation will now be made to a method of manufacturing the magnetic field sensor having the above structure.

FIGS. 4A to 4J are diagrams each illustrating a manufacturing process of the magnetic field sensor.

A semiconductor substrate 100 is prepared for manufacturing the magnetic field sensor.

Figure 4:
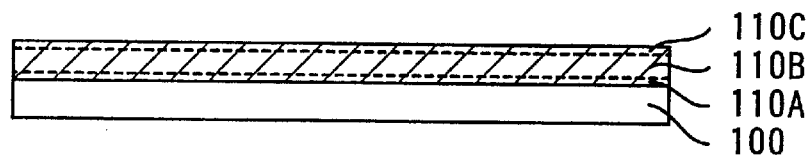
FIGS. 4A to 4J are diagrams each showing a process for manufacturing the magnetic field sensor shown in FIG. 1.
Figure 4:
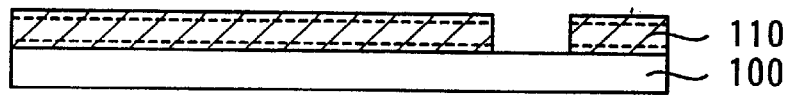
Figure 4:
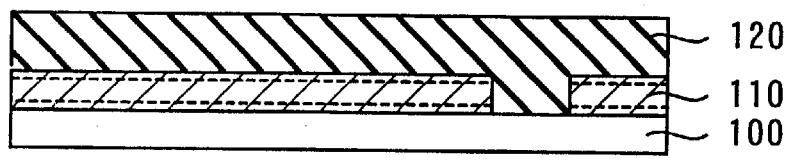
Figure 4:
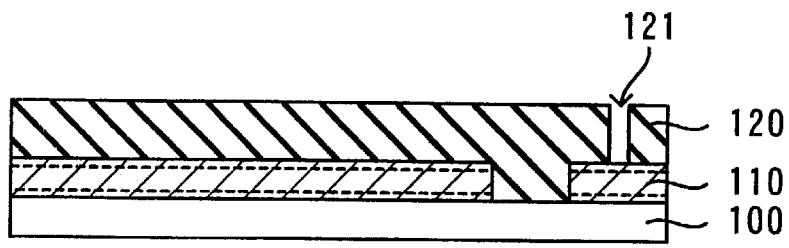
Figure 4:
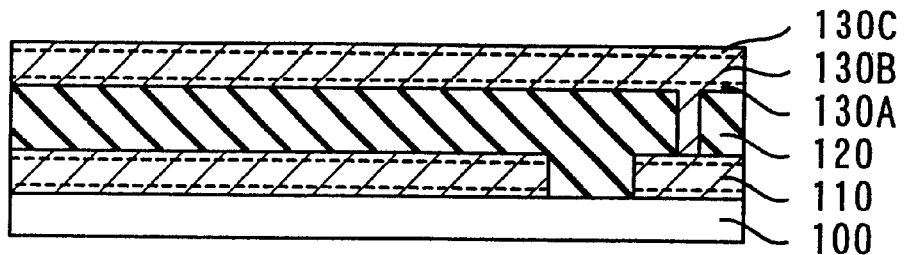
Figure 4:
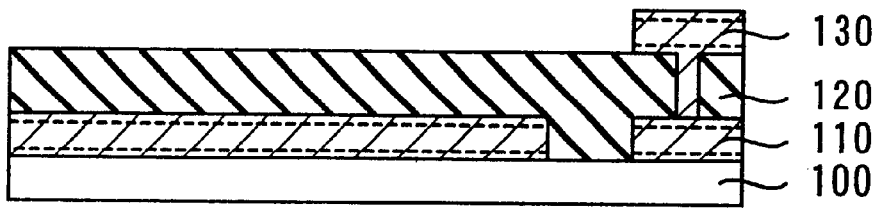
Figure 4:
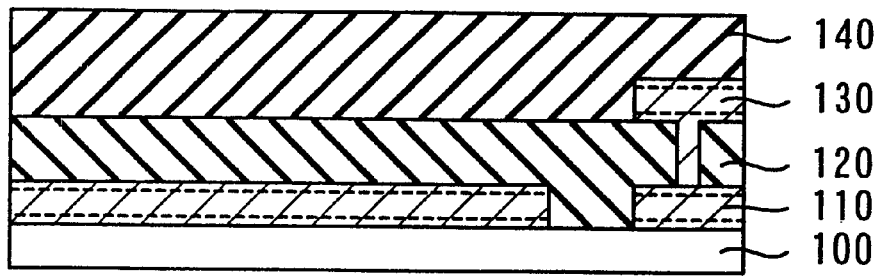
Figure 4:
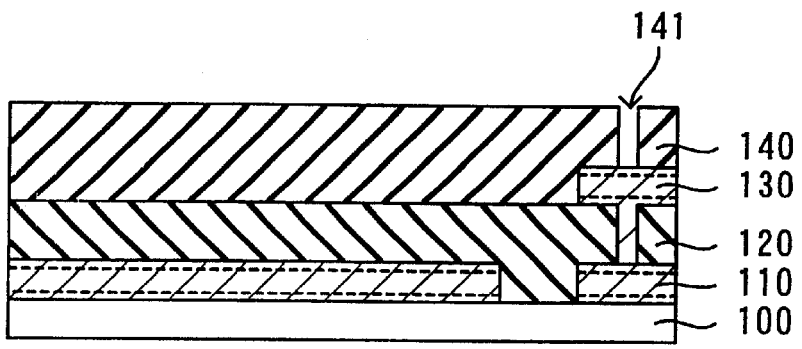
Figure 4:
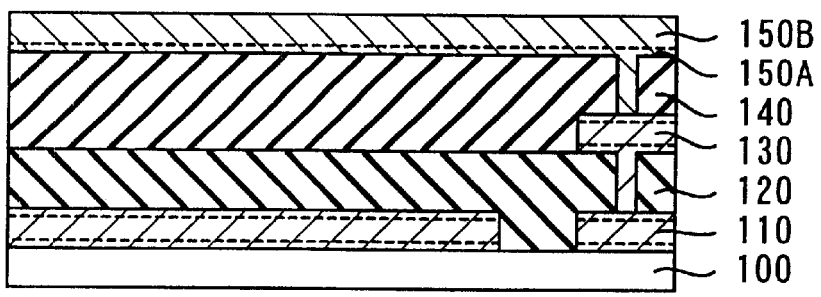
Figure 4:
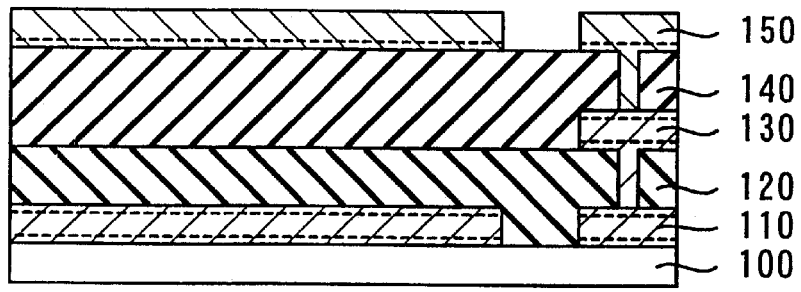

As shown in FIG. 4A, a titanium film 110A which is approximately 50 nm in thickness is formed, while a copper film 110B which is approximately 2 μm in thickness is formed on the titanium film 110A, and a titanium film 110C which is approximately 50 nm in thickness is formed on the copper film 110B using a sputtering method, for example. The titanium films are formed in order to enhance airtightness between the copper film and the semiconductor substrate or an insulating film.

As shown in FIG. 4B, the titanium film 110A, the copper film 110B and the titanium film 110C are patterned using a photolithography technique, an etching method or the like. Specifically, the titanium film 110A, the copper film 110B and the titanium film 110C are patterned in a form identical with that of the first conductor 110 shown in FIG. 2A. By doing this, the first conductor 110 is formed.

As illustrated in FIG. 4C, a first insulating film 120 which is approximately 3 μm in thickness is formed on the semiconductor substrate 100 and the first conductor 110, using a sputtering method, a CVD (Chemical Vapor Deposition) method or the like.

Then, a via hole 121, as shown in FIG. 4D, is formed in a predetermined area of the first insulating film 120 with a photolithography and etching technique.

As shown in FIG. 4E, a titanium film 130A which is approximately 50 nm in thickness is formed on the first insulating film 120, while a copper film 130B which is approximately 1 μm in thickness is formed on the titanium film 130A, and a titanium film 130C which is approximately 50 nm in thickness is formed on the copper film 130B using a sputtering technique, etc. Now, the titanium film 130A and the first conductor 110 are electrically connected through the via hole 121. In other words, the titanium film 130A formed in the via hole 121 serves as a connector which electrically connects the first conductor 110 and the titanium film 130A.

As shown in FIG. 4F, the titanium film 130A, the copper film 130B and the titanium film 130C are patterned with an ion milling technique, or the like. To be more specific, the titanium film 130A, the copper film 130B and the titanium film 130C are patterned in a form identical with that of the second conductor 130 illustrated in FIG. 2B, thereby forming the second conductor 130.

As illustrated in FIG. 4G, a second insulating film 140 which is approximately 3 μm in thickness is formed on the second conductor 130 by a sputtering technique, etc.

A via hole 141 is formed in a predetermined area of the second insulating film 140 using a photolithography and etching technique, as shown in FIG. 4H.

As illustrated in FIG. 4I, a titanium film 150A which is approximately 50 nm in thickness is formed on the second insulating film 140, while a copper film 150B which is approximately 2 μm in thickness is formed on the titanium film 150A using a sputtering technique, for example. By doing so, the titanium film 150A and the second conductor 130 are electrically connected via the via hole 141. In other words, the titanium film 150A formed in the via hole 141 serves as a connector which electrically connects the second conductor 130 and the titanium film 150A.

As shown in FIG. 4J, the titanium film 150A and the copper film 150B are patterned using a photolithography and etching technique. Specifically, the titanium film 150A and the copper film 150B are patterned in a form identical with that of the third conductor 150 shown in FIG. 2C, thereby forming the third conductor 150 thereon.

The magnetic field sensor according to the first embodiment is thus completely formed.

As explained so far, the magnetic field sensor can be completely formed by some processes which are employed in manufacturing semiconductor devices, etc. Thus, the magnetic field sensor can be miniaturized and be incorporated with the semiconductor device or wiring, within or from which a magnetic field to be measured is generated, into the semiconductor integrated circuits. The space distribution of the magnetic field generated by a current flowing through the semiconductor device or wiring can accurately be measured. That is, the current flowing through the semiconductor device or wiring can accurately be measured. Since it would be possible that the magnetic field sensor can be made smaller than the conventional ones, its inductance becomes smaller, and the sensitivity in a high frequency band can be controlled not be lowered.

(Second Embodiment)

A magnetic field sensor according to the second embodiment of the present invention will no be explained with reference to the accompanying drawings.

Figure 5:
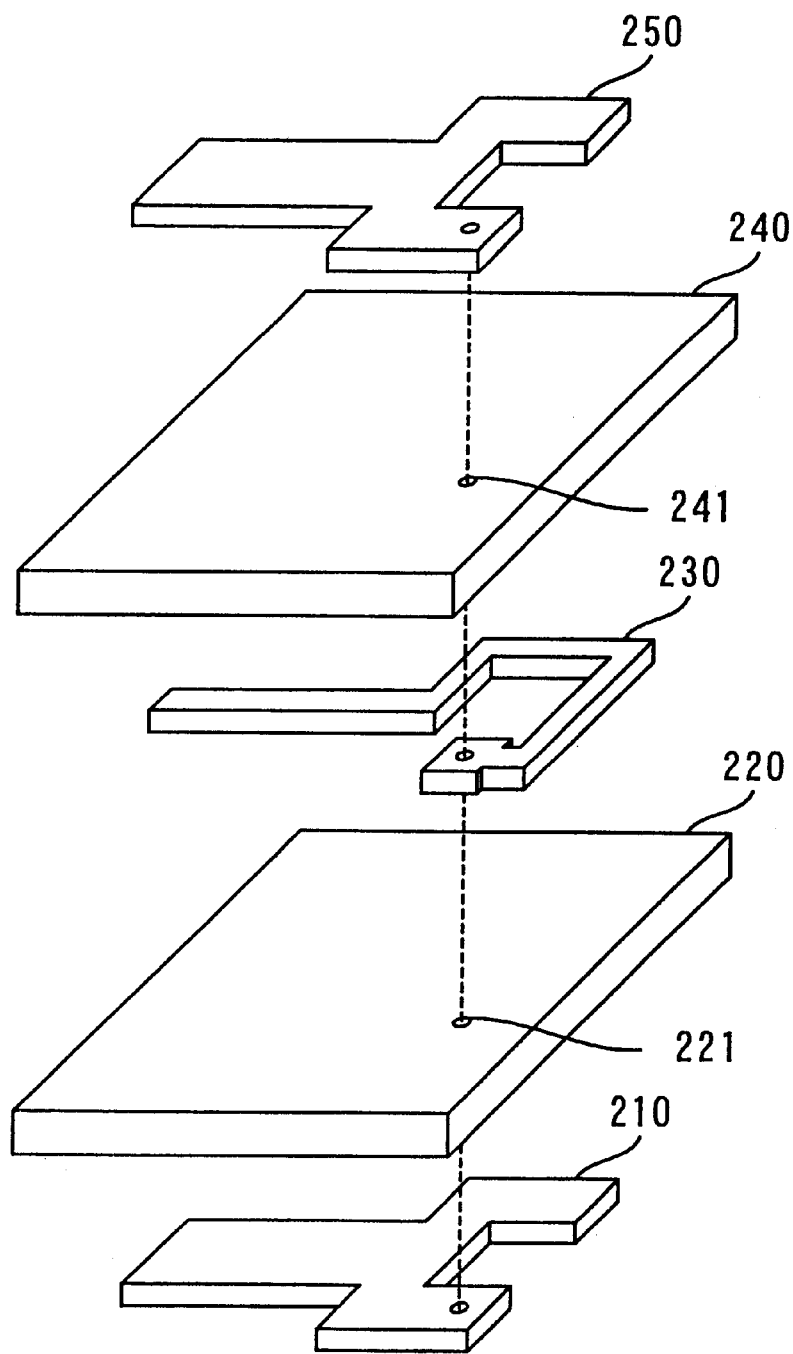
FIG. 5 is a diagram showing the structure of a magnetic field sensor according to the second embodiment of this invention.

FIG. 5 is a diagram showing the structure of the magnetic field sensor according to the second embodiment, and illustrates a main part of the structure of the magnetic field sensor.

As illustrated in FIG. 5, the magnetic field sensor comprises a first conductor 210, a first insulating film 220, a second conductor 230, a second insulating film 240 and a third conductor 250.

The first conductor 210 is formed of three layers of, for example, Ti/Cu/Ti (titanium/copper/titanium), and is substantially rectangular in cross section.

The first insulating film 220 is formed of, for example, SiOx, and is formed on the first conductor 210. The first insulating film 220 has a via hole 221 in its predetermined area.

The second conductor 230 is formed of three layers of, for example, Ti/Cu/Ti (titanium/copper/titanium), and is formed on the first insulating film 220. The second conductor 230 is electrically connected to the first conductor 210 via the via hole 121. The second conductor 230 is substantially rectangular in cross section.

The second insulating film 240 is formed of, for example, SiOx, and is formed on the second conductor 230. The second insulating film 240 includes a via hole 241 formed in a position vertically overlapping with the position of the via hole 221.

The third conductor 250 is formed of two layers of, for example, Ti/Cu (titanium/copper), and is formed on the second insulating film 240. The third conductor 250 is electrically connected to the second conductor 230 via the via hole 241. The third conductor 250 is substantially rectangular in cross section.

Figure 6A:
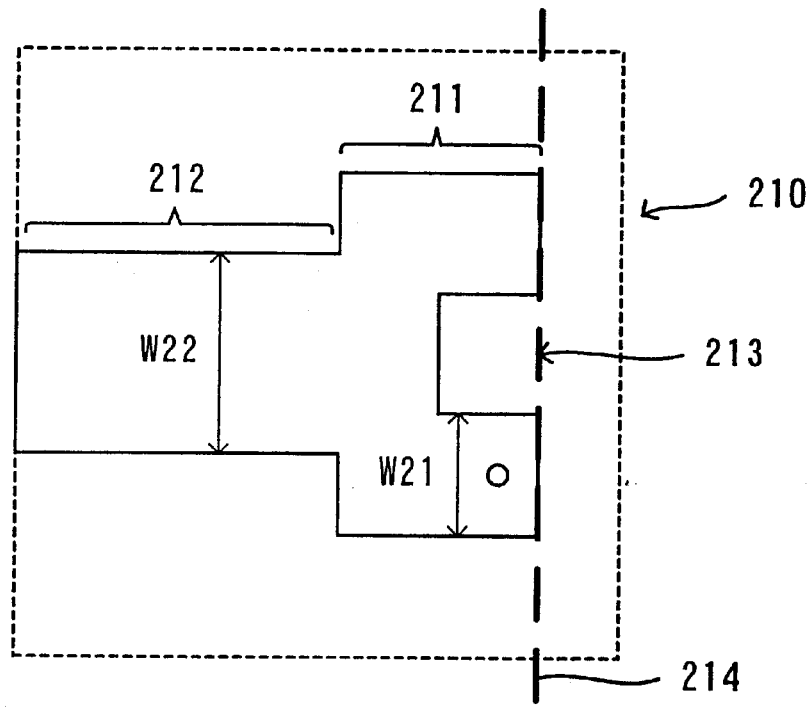
FIGS. 6A to 6D are diagrams each showing a formation pattern of a conductor constituting the magnetic field sensor shown in FIG. 5.
Figure 6B:
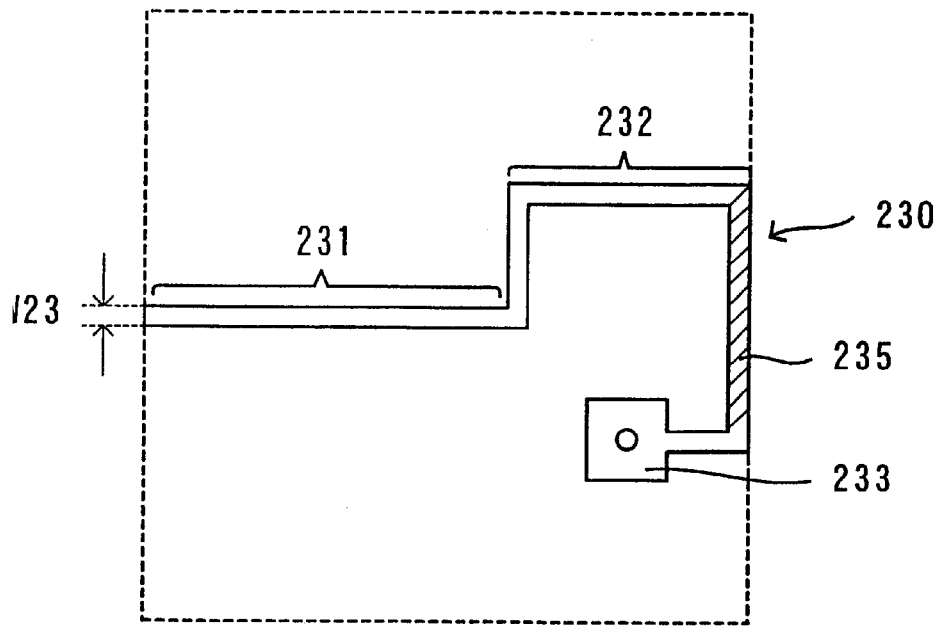
Figure 6:
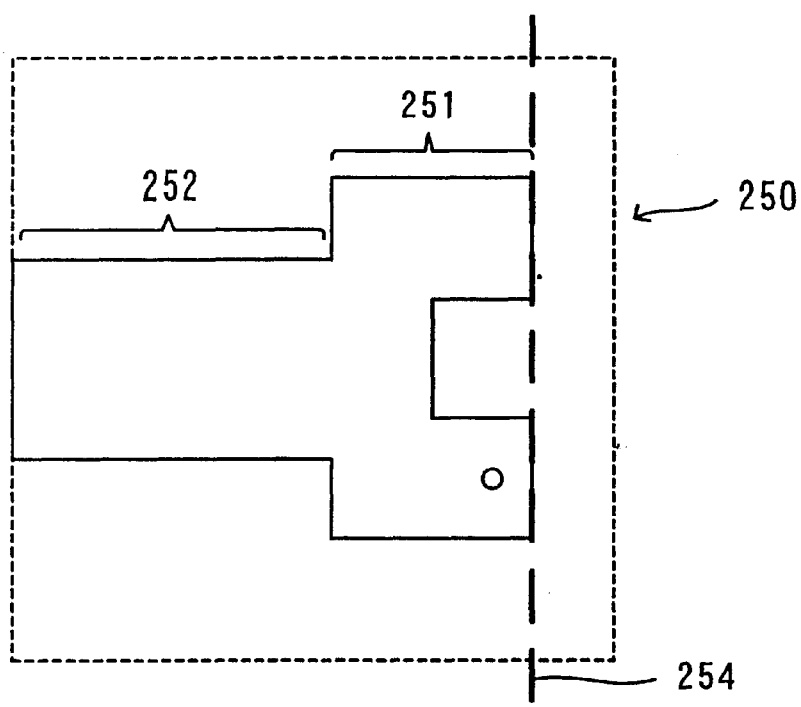
Figure 6:
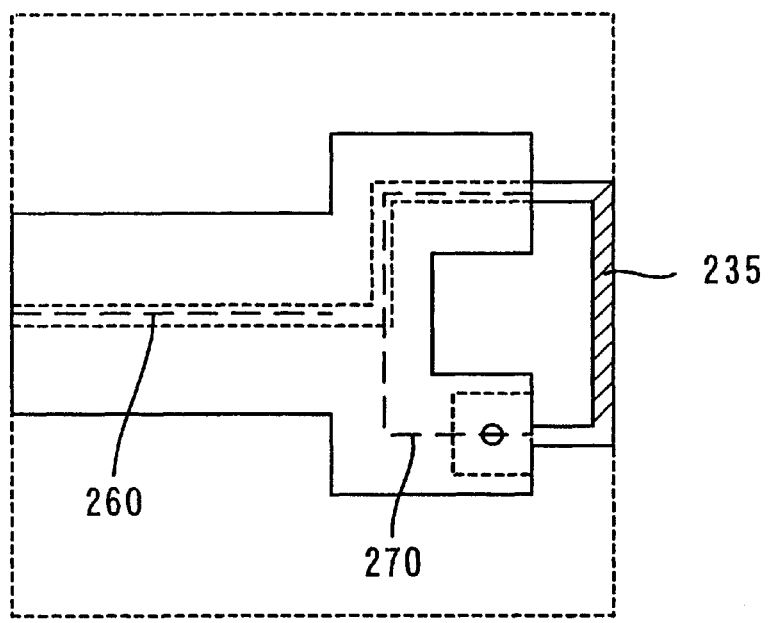

FIGS. 6A to 6D are plane views respectively illustrating formation patterns of the first conductor 210, the second conductor 230 and the third conductor 250. To be more specific, FIG. 6A shows a formation pattern of the first conductor 210, FIG. 6B shows a formation pattern of the second conductor 230, FIG. 6C shows a formation pattern of the third conductor 250, and FIG. 6D shows a state where the first conductor 210, the second conductor 230 and the third conductor 250 overlap with each other. In each of FIGS. 6B and 6D, the hatching does not represent a cross section, but it indicates an area instead.

The first conductor 210 comprises a "U-shaped" portion 211, a portion formed in a letter "U" like shape, and a linear portion 212.

The "U-shaped" portion 211 is formed in an open loop shape. Specifically, the "U-shaped" portion 211 is formed in such a shape that it has been bent into a U-like shape with a gap 213.

The linear portion 212 is connected to one side of the "U-shaped" portion 211, specifically to the opposite side of the gap 213 at a right angle to the "U-shaped" portion 211. The width W22 of the linear portion 212 is broader than the width W21 of the "U-shaped" portion 211.

The second conductor 230 is formed in such a shape that it has been bent into a ladle-like shape, as shown in FIG. 6B. That is, the second conductor 230 is formed of a linear portion 231 corresponding to the handle of the ladle and a bent portion 232 corresponding to the vessel of the ladle and formed in an open loop shape. The width W23 of the second conductor 230 is narrower than the width W21 of the "U-shaped" portion 211. A pad 233 is formed in one end of the second conductor 230.

The linear portion 231 is so formed on the first insulating film 220 as to overlap with a center line 260 of the linear portion 212, as shown in FIG. 6D.

As shown in FIG. 6D, the bent portion 232 is so formed on the first insulating film 220 that its side 235 corresponding to one end of the ladle crosses over the gap 213 from one end of the "U-shaped" portion 211 to the other end. The bent portion 232 is formed in such a way that its one side 235 is outward with respect to the "U-shaped" portion 211, as shown in FIG. 6D. The rest of two sides of the bent portion 232 are formed as to overlap with a center line 270 of the "C-shaped" portion 211.

The pad 233 is electrically connected to the other end of the "U-shaped" portion 211 via the via hole 221 formed in the first insulating film 220.

The third conductor 250 is formed in a shape which is substantially identical with that of the first conductor 210. Specifically, as illustrated in FIG. 6C, the third conductor 250 is composed of a "U-shaped" portion 251 and a linear portion 252. The third conductor 250 is formed on the second insulating film 240 such that its outward form corresponds to that of the first conductor 210. In this case, a straight line 254, through which an outer edge of the one end and an outer edge of the other end of the "U-shaped" portion 251 are connected with each other, substantially overlaps with a straight line 214, through which an outer edge of the one end and an outer edge of the other end of the "U-shaped" portion 211 are connected with each other. The third conductor 250 is electrically connected to the second conductor 230 via the via hole 241 which is formed in a position substantially and vertically overlapping with that of the via hole 221.

As explained above, the first conductor 210, the second conductor 230 and the third conductor 250 are electrically connected with each other, thereby forming a loop. Furthermore, the first conductor 210, the second conductor 230 and the third conductor 250 form a strip transmission line.

The first, second and third conductors 210, 230 and 250 are formed in the above-described structure, therefore, the outward form of a projection, in which those conductors are shown as to overlap with each other, is symmetric with respect to the center line 260, as shown in FIG. 6D.

Likewise in the first embodiment, the widths of the first, second and third conductors 210, 230 and 250 are so set that there is substantially no end effect of the electromagnetic field which may occur in the magnetic field sensor.

The widths of the first, second and third conductors 210, 230 and 250 are so set that characteristic impedance of the strip transmission line coincides with characteristic impedance of a measuring device connected to the magnetic field sensor and characteristic impedance of a coaxial cable connecting the magnetic field sensor to the measuring device when measuring a magnetic field.

In a case of measuring a magnetic field which is generated by a current flowing through wiring formed on a print substrate or a semiconductor substrate, the magnetic field sensor is arranged in such a way that its loop side faces the wiring, likewise in the first embodiment. The first, second and third conductors 210, 230 and 250 are all connected to a measuring device via a pad, cable, etc. In this case, the first conductor 210 and the third conductor 250 are both grounded. A resistor is connected between the first and second conductors 210 and 230, and another resistor is connected between the second and third conductors 230 and 250.

When measuring the magnetic field, the magnetic field generated by a current flowing through the wiring goes across the loop of the magnetic field sensor, thereby generating an electromotive force whose magnitude is in proportion to a change rate of the magnetic field. The measuring device detects, as an output signal, the voltage which has been generated on the ends of the resistor connected between the first and second conductors 210 and 230 and on the ends of the resistor between the second and third conductors 230 and 250.

As explained above, the widths of the first, second and third conductors 210, 230 and 250 are so set that the characteristic impedance of the strip transmission line coincides with the characteristic impedance of the coaxial cable and the measuring device. Hence, it becomes possible to measure a magnetic field generated by a current flowing through a semiconductor integrated circuit wherein an operational frequency is set at any GHz in order. Furthermore, a signal output from the magnetic field sensor toward the measuring device 180, etc. can be restrained from reflecting.

Moreover, as described above, the first, second and third conductors 210, 230 and 250 are formed, therefore, the second conductor 230 can electrically be sealed by the first and third conductors 210 and 250. Then, the voltage which has been induced by an electric field can be restrained, and, as an output signal, the voltage induced by a magnetic field to be measured which has been generated by a current flowing through the semiconductor integrated circuit, etc. is output. The space distribution of the magnetic field can accurately be measured.

As explained above, the side 233 of the bent portion 232, which corresponds to the front end of the ladle, is formed outward with respect to the "U-shaped" portion 211. Therefore, when measuring the magnetic field generated by a current flowing through the wiring, etc., the loop can approach the wiring or the like. In taking this circumstance into consideration, even if a plurality of magnetic field generating sources are present, the magnetic field sensor can measure merely the magnetic field from a particular magnetic field generating source, and have a high space resolution.

The method of manufacturing the magnetic field sensor having the above-described structure is substantially the same as that described in the first embodiment. Thus, the magnetic field sensor according to the second embodiment can easily be manufactured in miniaturized size, likewise in the first embodiment. The magnetic field sensor can be incorporated with the semiconductor device or wiring, within or from which a magnetic field to be measured is generated, into the semiconductor integrated circuits. The space distribution of the magnetic field generated by a current flowing through the semiconductor device or wiring can accurately be measured. That is, the current flowing through the semiconductor device or wiring can accurately be measured. Since it would be possible that the magnetic field sensor can be made smaller than the conventional ones, its inductance becomes smaller, and the sensitivity in a high frequency band can be controlled not be lowered.

(Third Embodiment)

A magnetic field sensor according to the third embodiment of the present invention will now be explained with reference to the accompanying drawings.

Figure 7:
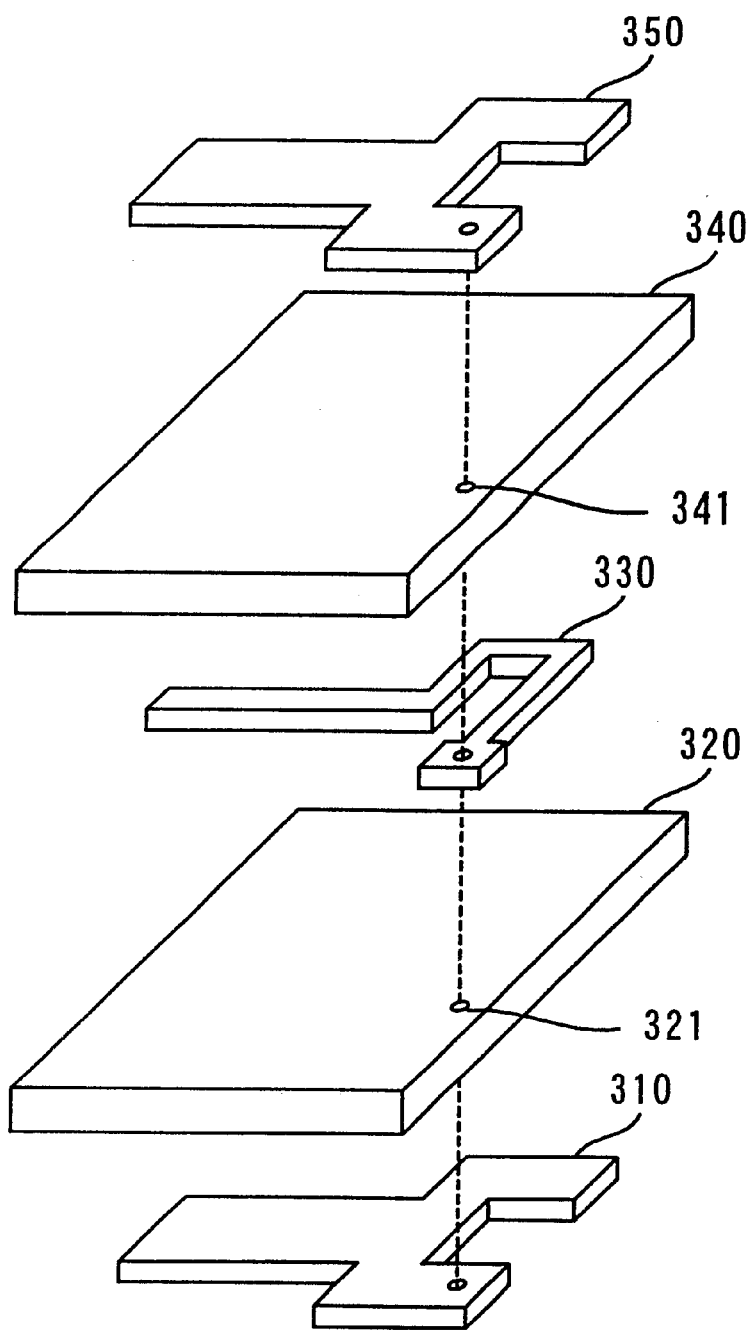
FIG. 7 is a diagram showing the structure of a magnetic field sensor according to the third embodiment of this invention.

FIG. 7 is a diagram showing the structure of the magnetic field sensor according to the third embodiment, and illustrates the main part of the magnetic field sensor.

As shown in FIG. 7, the magnetic field sensor comprises a first conductor 310, a first insulating film 320, a second conductor 330, a second insulating film 340 and a third conductor 350.

The first conductor 310 is formed of three layers of, for example, Ti/Cu/Ti (titanium/copper/titanium). The first conductor 310 is substantially rectangular in cross section.

The first insulating film 320 is formed of, for example, SiOx, and is formed on the first conductor 310. The first insulating film 320 has a via hole 321 in its predetermined area.

The second conductor 330 is formed of three layers of, for example, Ti/Cu/Ti (titanium/copper/titanium), and is formed on the first insulating film 320. The second conductor 330 is electrically connected to the first conductor 310 via the via hole 321. The second conductor 330 is substantially rectangular in cross section.

The second insulating film 340 is formed of, for example, SiOx, on the second conductor 330. The second insulating film 340 has a via hole 341 in a position vertically overlapping with that of the via hole 321.

The third conductor 350 is formed of two layers of, for example, Ti/Cu (titanium/copper), and is formed on the second insulating film 340. The third conductor 350 is electrically connected with the second conductor 330 via the via hole 341. The third conductor 350 is substantially rectangular in cross section.

Figure 8A:
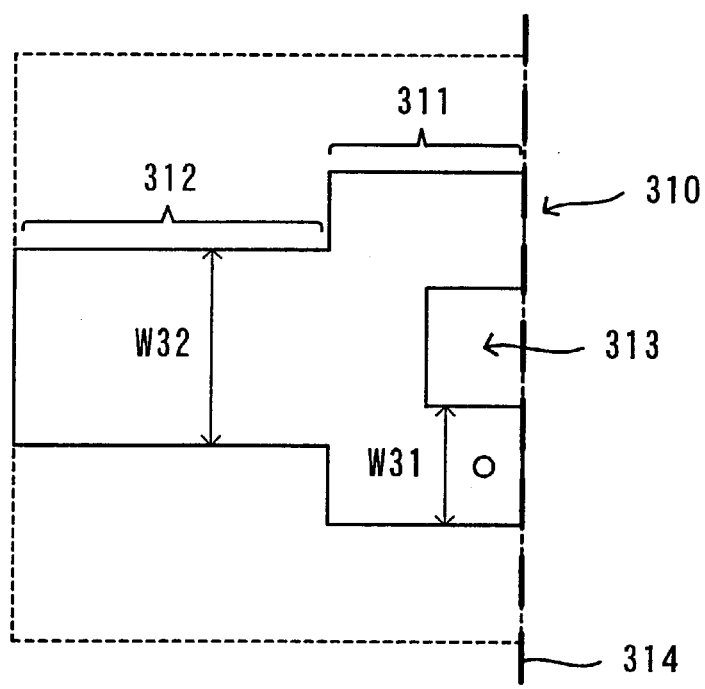
FIGS. 8A to 8D are diagrams each showing a formation pattern of a conductor constituting the magnetic field sensor shown in FIG. 7.
Figure 8B:
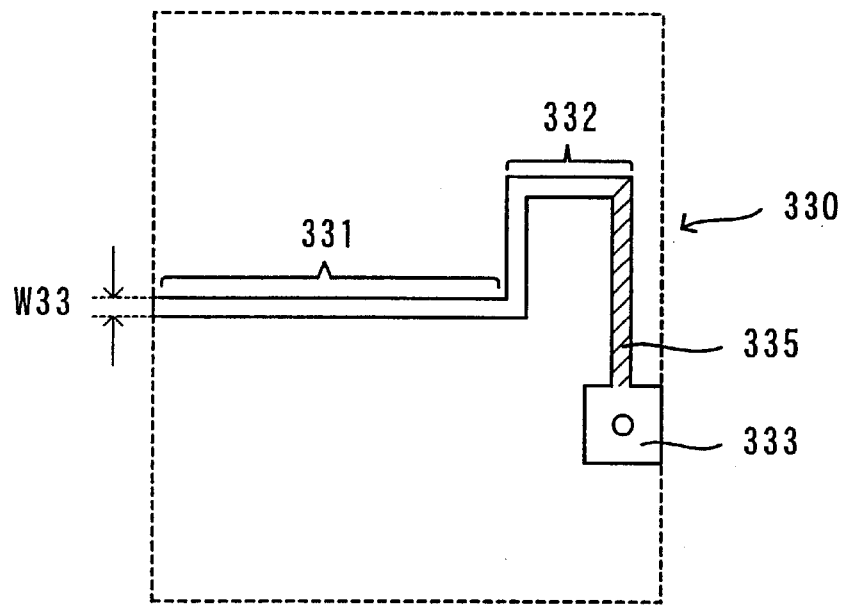
Figure 8C:
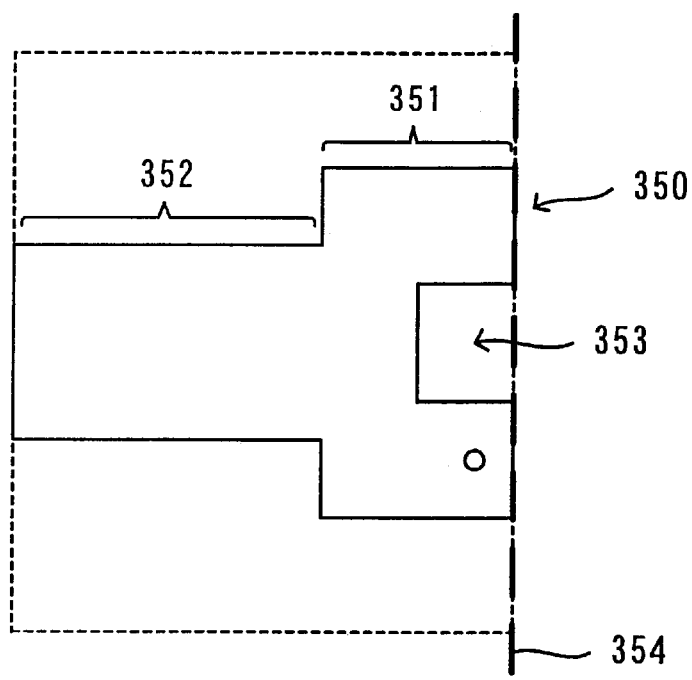
Figure 8D:
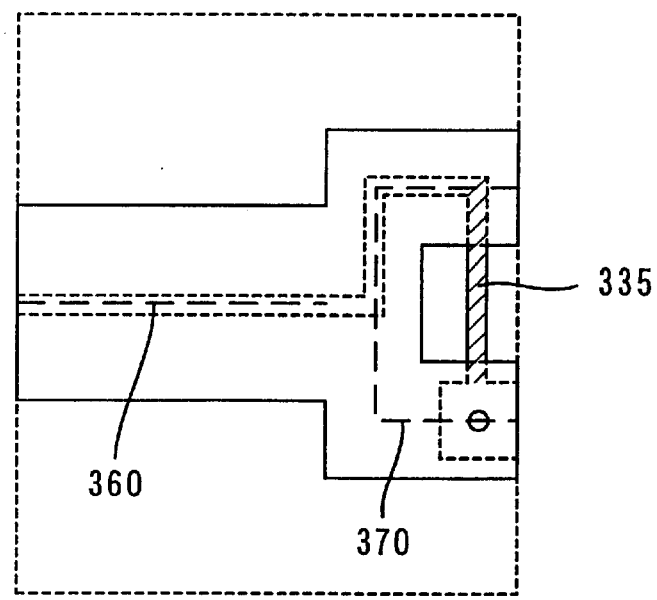

FIGS. 8A to 8D are plane views each showing a formation pattern of either one of the first, second and third conductors 310, 330 and 350. Specifically, FIG. 8A shows the formation pattern of the first conductor 310, FIG. 8B shows the formation pattern of the second conductor 330, FIG. 8C shows the formation pattern of the third conductor 350, and FIG. 8D shows a state where the first, second and third conductors 310, 330 and 350 overlap with each other.

The first conductor 310 is composed of a "U-shaped" portion 311 and a linear portion 312, as illustrated in FIG. 8A.

The "U-shaped" portion 311 is formed in such a way that it has been bent in a U-like shape with a gap 313.

The linear portion 312 is connected to one side of the "U-shaped" portion 311, specifically to the opposite side of the gap 313 at a right angle to the "U-shaped" portion 311. The width W32 of the linear portion 312 is broader than the width W31 of the "U-shaped" portion 311.

The second conductor 330 is formed in such a way that it has been bent in a ladle-like shape, as shown in FIG. 8B. That is, the second conductor 330 is formed of a linear portion 331 corresponding to the handle of the ladle and a bent portion 332 corresponding to the vessel of the ladle and formed in an open loop shape. The width W33 of the second conductor 330 is narrower than the width W31 of the "U-shaped" portion 311. A pad 333 is formed in one end of the second conductor 330.

The linear portion 331 is so formed on the first insulating film 320 as to overlap with a center line 360 of the linear portion 312, as shown in FIG. 8D.

As shown in FIG. 8D, the bent portion 332 is so formed on the first insulating film 320 that its side 335 (indicated with the hatching in the illustration) corresponding to one end of the ladle crosses over the gap 313 from one end of the "U-shaped" portion 311 to the other end. The bent portion 332 is formed in such a way that the side 335 is formed inward with respect to the "U-shaped portion 311, as shown in FIG. 8D. That is, the side 335 corresponding to the very end of the ladle is formed in the gap 313 of the "U-shaped" portion 311. The rest of two sides of the bent portion 332 are formed as to overlap with a center line 370 of the "U-shaped" portion 311.

The pad 333 is electrically connected to the other end of the "U-shaped" portion 311 via the via hole 321 formed in the first insulating film 320.

The third conductor 350 is formed in a shape substantially the same as that of the first conductor 310. Specifically, the third conductor 350, as shown in FIG. 8C, is formed of a "U-shaped" portion 351 and a linear portion 352. The third conductor 350 is formed on the second insulating film 340 such that its outward form corresponds to that of the first conductor 310. In this case, a straight line 354, through which an outer edge of the one end and an outer edge of the other end of the "U-shaped" portion 351 are connected with each other, substantially overlaps with a straight line 314, through which an outer edge of the one end and an outer edge of the other end of the "U-shaped" portion 311 are connected with each other. The third conductor 350 is electrically connected to the second conductor 330 via the via hole 341 which is formed in a position substantially and vertically overlapping with the position of the via hole 321.

As explained above, the first, second and third conductors, 310, 330 and 350 are electrically connected with each other, thereby forming a loop. Furthermore, the first conductor 310, the second conductor 330 and the third conductor 350 form a strip transmission line.

The first, second and third conductors 310, 330 and 350 are formed in the above-described structure, therefore, the outward form of a projection, in which those conductors are shown as to overlap with each other, is symmetric with respect to a center line 360, as shown in FIG. 8D.

Likewise in the first embodiment, the first, second and third conductors 310, 330 and 350 are so set that there is substantially no end effect of the electromagnetic field which may occur in the magnetic field sensor.

The widths of the first, second and third conductors 310, 330 and 350 are set in such a way that characteristic impedance of the strip transmission line coincides with characteristic impedance of a measuring device connected to the magnetic field sensor and characteristic impedance of a coaxial cable connecting the magnetic field sensor to the measuring device when measuring a magnetic field.

In a case of measuring a magnetic field which is generated by a current flowing through the wiring formed on a print substrate or a semiconductor substrate, the magnetic field sensor is arranged in such a way that its loop side faces the wiring, as in the first embodiment. The first, second and third conductors 310, 330 and 350 are all connected to the measuring device via a pad, cable, etc. In this case, the first and third conductors 310 and 350 are grounded. A resistor is connected between the first and second conductors 310 and 330, and another resistor is connected between the second and third conductors 330 and 350.

When measuring the magnetic field, the magnetic field generated by a current flowing through the wiring goes across the loop of the magnetic field sensor, thereby generating an electromotive force whose magnitude is in proportion to a change rate of the magnetic field. The measuring device takes out as an output signal the voltage which has been generated on the ends of the resistor connected between the first and second conductors 310 and 330 and on the ends of the resistor between the second and third conductors 330 and 350.

As explained above, the widths of the first, second and third conductors 310, 330 and 350 are set in such a way that the characteristic impedance of the strip transmission line coincides with the characteristic impedance of the coaxial cable and the measuring device. Hence, it becomes possible to measure a magnetic field to be generated by a current flowing through a semiconductor integrated circuit wherein an operational frequency is set at any GHz in order. Furthermore, a signal to be output from the magnetic field sensor to the measuring device, etc., is restrained from reflecting.

As described above, the first, second and third conductors 310, 330 and 350 are thus formed, therefore, the second conductor 330 can electrically be sealed by the first and third conductors 310 and 350. Then, the voltage which has been induced by an electric field can be restrained, and as an output signal, the voltage induced by a magnetic field to be measured which has been generated by a current flowing through the semiconductor integrated circuit, etc. is output. The space distribution of the magnetic field can accurately be measured.

As explained above, the side 335 of the bent portion 332 which corresponds to the front end of the ladle is formed in the gap 313 of the "U-shaped" portion 311. Let it be assumed that a plurality of magnetic field sources are formed on the semiconductor substrate. In this case, when the manufactured magnetic field sensor is severed from the semiconductor substrate, the loop can be prevented from being broken down as a result of severance of one part of the second conductor 330. That is, as long as the second conductor 330 is not severed, the first or third conductor 301 or 305 may be severed. Thus, the magnetic field sensor can be manufactured such that the loop approaches the wiring, etc. when measuring the magnetic field generated by a current flowing through the wiring, etc. Even if a plurality of magnetic field generating sources are present, the magnetic field sensor can measure simply the to-be-measured magnetic field generated by a particular magnetic field generating source. As a result of this, the magnetic field sensor has a high space resolution.

The method of manufacturing the magnetic field sensor having the so-far described structure is substantially identical with that described in the first embodiment.

As explained in the first embodiment, the magnetic field sensor is formed when a plurality of conductors and insulating films are laminated, resulting in a reduction of the size of the magnetic field sensor. Hence, the magnetic field sensor can be incorporated into the semiconductor integrated circuit, so that the current which flows into the wiring of the semiconductor integrated circuit can be measured with high efficiency. Since the magnetic field sensor can be made smaller, its inductance becomes smaller and the sensitivity in a high frequency band can be controlled not be lowered.

The magnetic field sensor can be used as a magnetic field generating device by supplying a current to the loop. By doing this, the magnetic field sensor can be used as a magnetic field generating device for performing an electromagnetic resisting test, in terms of micro-areas.

The first and third conductors 110 and 150, which have been described in the first embodiment, may respectively have the "U-shaped" portions 211, 251, 311 and 351 which are shown in the second and third embodiments, in place of the "C-shaped" portions 111 and 151. In this case, the second conductor 130 may be formed in such a style that its side 135 corresponding to the front end of the ladle overlaps with the straight line, through which an outer edge of one end and an outer edge of the other end of the "U-shaped" portion of the first conductor 110 are connected with each other.

The first and third conductors 310 and 350 described in the third embodiment may respectively have the "C-shaped" portion 111 and 151, instead of the "U-shaped" portions 311 and 351. In this case, the second conductor 330 may be formed in such a way that its side 335 corresponding to the front end of the ladle is formed in the gap of the "C-shaped" portion of the first conductor 310.

The first conductors 110, 210 and 310, the second conductors 120, 220 and 320, and the third conductors 310, 320 and 330 all of which are described in the first to third embodiments may be formed in such a way that they are each formed in a curve-like shape, instead of in a bent shape.

Various embodiments and changes may be made thereonto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H11-153259 filed on Jun. 1, 1999, and including specification, claims, drawings and summary. The disclosure of the above Japanese Patent Application is incorporated herein by reference in its entirety.

What is claimed is:

1. A magnetic field sensor comprising:

a first conductor layer having a first loop portion which is in an open loop shape and which includes two ends and a gap therebetween;

a second conductor layer having a second loop portion formed in an open loop shape on said first conductor layer; and a third conductor layer formed on said second conductor layer and having a third loop portion which is formed in an open loop shape and which has two ends and a gap therebetween, wherein said third loop portion is open in a direction substantially identical with an opening direction of said first loop portion and is formed in such a way that a first straight line, through which one end and other end of said first loop portion are connected with each other, substantially overlaps with a second straight line, through which one end and other end of said third loop portion are connected with each other, said second loop portion is formed in such a way that one side of said second loop portion overlaps with the first and second straight lines of said first loop portion and said third loop portion and that another side of said second loop portion is formed outward with respect to said first loop portion and said second loop portion and crosses over the gaps of said first loop portion and said third loop portion from the one ends of said first loop portion and said third loop portion to the other ends thereof, and the one side of said second loop portion is electrically connected to the one ends or the other ends of said first loop portion and said third loop portion, thereby forming a loop.

2. The magnetic field sensor according to claim 1, further comprising:

a first insulating layer which is formed between said first conductor layer and said second conductor layer and which has a hole in a position corresponding to the one end or the other end of said first loop portion; and a second insulating layer which is formed between said second conductor layer and said third conductor layer and which has a hole in a position substantially identical with a position of the hole of said first insulating layer.

3. The magnetic field sensor according to claim 2, wherein:

said third loop portion is formed in a shape which is substantially identical with a shape of said first loop portion; and width of said second loop portion is narrower than width of said first loop portion and said third loop portion, and said second loop portion is electrically sealed by said first loop portion and said third loop portion.

4. The magnetic field sensor according to claim 3, wherein the first straight line connects an outer edge of the one end and an outer edge of the other end of said first loop portion, and the second straight line connects an outer edge of the one end and an outer edge of the other end of said third loop portion.

5. The magnetic field sensor according to claim 4, wherein said first conductor layer, said second conductor layer and said third conductor layer are formed of a titanium film formed on said first and/or second insulating layers and a copper film formed on said titanium film.

6. The magnetic field sensor according to claim 5, wherein:

said first conductor layer includes said first loop portion, which is formed in a letter "C" or "U" like shape, and further includes a first linear portion, which is connected to an opposite side of the gap of said first loop portion;

said second conductor layer further includes a second linear portion, which is so connected to said second loop portion as to be formed in a ladle like shape; and said third conductor layer includes said third loop portion, which is formed in a letter "C" or "U" like shape, and further includes a third linear portion, which is connected to an opposite side of the gap of said third loop portion.

7. A system for measuring a magnetic field, comprising a magnetic field sensor, a measuring device and a wire, wherein, said magnetic field sensor includes a first conductor layer having a first loop portion which is formed in an open loop shape and which includes two ends and a gap therebetween, a first insulating layer which is formed on said first conductor layer and which has a hole in one end of the first loop portion, a second conductor layer which has a second loop portion, having one side crossing over the gap of the first loop portion from other end of the first loop portion to one end along a first straight line, through which one end and other end of the first loop portion are connected with each other, or in an outside of the first loop, and being formed in an open loop shape and having a connector electrically connecting said second conductor layer and said first conductor layer via the hole of said first insulating film, a second insulating layer which is formed on said second conductor layer and which has a hole in a position substantially identical with a position of the hole of said first insulating layer, and a third conductor layer which is formed on said second insulating layer, and which has a third loop portion having two ends and a gap and being formed in an open loop shape which is open in a direction substantially identical with an opening direction of said first loop portion, including a connector electrically connecting said third conductor layer to said second conductor layer via the hole of said second insulating layer, and being formed in such a way that a second straight line, through which one end and other end of said third conductor layer are connected with each other, substantially overlaps with the first straight line, and said magnetic field sensor outputting an electric signal whose magnitude is in proportion to a change rate of a magnetic field crossing over a loop, which has been formed when said first conductor layer, said second conductor layer and said third conductor layer are electrically connected with each other, and having characteristic impedance which is substantially identical with characteristic impedance of said measuring device and said wire, said measuring device measuring strength of a magnetic field based on the electric signal output by said magnetic field sensor; and said wire connecting said magnetic field sensor and said measuring device.

8. The system for measuring a magnetic field according to claim 7, wherein:

width of the first loop portion and the third loop portion is broader than width of the second loop portion; and the second loop portion is electrically sealed by the first loop portion and the third loop portion.

9. The system for measuring a magnetic field according to claim 8, wherein the first straight line connects an outer edge of the one end and an outer edge of the other end of said first loop portion, and the second straight line connects an outer edge of the one end and an outer edge of the other end of said third loop portion.

* * * * *